United States Patent
Min et al.

(10) Patent No.: US 10,790,428 B2
(45) Date of Patent: Sep. 29, 2020

(54) P-TYPE SKUTTERUDITE THERMOELECTRIC MATERIAL, METHOD FOR PREPARING THE SAME, AND THERMOELECTRIC DEVICE INCLUDING THE SAME

(71) Applicant: LG CHEM, LTD., Seoul (KR)

(72) Inventors: Yu Ho Min, Daejeon (KR); Su Jeong Lee, Daejeon (KR); Ye Seul Lee, Daejeon (KR); Cheol-Hee Park, Daejeon (KR); Jae Hyun Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 366 days.

(21) Appl. No.: 15/577,195

(22) PCT Filed: Nov. 2, 2016

(86) PCT No.: PCT/KR2016/012530
§ 371 (c)(1),
(2) Date: Nov. 27, 2017

(87) PCT Pub. No.: WO2017/082578
PCT Pub. Date: May 18, 2017

(65) Prior Publication Data
US 2018/0090656 A1    Mar. 29, 2018

(30) Foreign Application Priority Data

Nov. 11, 2015 (KR) .................. 10-2015-0158244
Oct. 13, 2016 (KR) .................. 10-2016-0133019

(51) Int. Cl.
*C22C 1/02* (2006.01)
*H01L 35/26* (2006.01)
(Continued)

(52) U.S. Cl.
CPC .............. *H01L 35/26* (2013.01); *B22F 3/105* (2013.01); *B22F 9/04* (2013.01); *C22C 1/02* (2013.01);
(Continued)

(58) Field of Classification Search
CPC . B22F 3/105; B22F 9/04; C22C 12/00; C22C 1/02; C22F 1/00; H01L 35/18; H01L 35/26; H01L 35/34
(Continued)

(56) References Cited

U.S. PATENT DOCUMENTS 6,069,312 A    5/2000 Fleurial et al.
6,207,886 B1   3/2001 Kusakabe et al.
(Continued)

FOREIGN PATENT DOCUMENTS

JP    11-40861 A       2/1999
JP    2000-252526 A    9/2000
(Continued)

OTHER PUBLICATIONS

Chen, "Recent Advances in Filled Skutterudite Systems", 21st International Conference on Thermoelectronics, 2002, pp. 42-47.
(Continued)

*Primary Examiner* — Jie Yang
(74) *Attorney, Agent, or Firm* — Birch, Stewart, Kolasch & Birch, LLP

(57) ABSTRACT

The present invention relates to a P-type skutterudite thermoelectric material, a method for preparing the same, and a thermoelectric device including the same. More specifically, the present invention relates to a P-type skutterudite thermoelectric material into which a specific filler and charge compensator are introduced, and which exhibits high thermoelectric performance, a method for preparing the same, and a thermoelectric device including the same.

9 Claims, 7 Drawing Sheets

(51) Int. Cl.

| | | |
|---|---|---|
| B22F 3/105 | (2006.01) | |
| B22F 9/04 | (2006.01) | |
| C22C 12/00 | (2006.01) | |
| C22F 1/00 | (2006.01) | |
| H01L 35/18 | (2006.01) | |
| H01L 35/34 | (2006.01) | |

(52) U.S. Cl.
CPC ............... *C22C 12/00* (2013.01); *C22F 1/00* (2013.01); *H01L 35/18* (2013.01); *H01L 35/34* (2013.01)

(58) Field of Classification Search
USPC ........................................................ 420/576
See application file for complete search history.

(56) References Cited

U.S. PATENT DOCUMENTS

| | | | |
|---|---|---|---|
| 6,207,888 B1 * | 3/2001 | Nolas .................. | H01L 35/18 136/236.1 |
| 6,759,586 B2 * | 7/2004 | Shutoh ................ | H01L 35/18 136/203 |
| 2005/0229963 A1 * | 10/2005 | He ....................... | C01G 51/006 136/236.1 |
| 2009/0208364 A1 | 8/2009 | Berardan et al. | |
| 2010/0294326 A1 | 11/2010 | Guo et al. | |
| 2013/0323110 A1 | 12/2013 | Backhaus-Ricoult et al. | |

FOREIGN PATENT DOCUMENTS

| | | |
|---|---|---|
| JP | 2008-7825 A | 1/2008 |
| JP | 2008-159680 A | 7/2008 |
| JP | 2008-535277 A | 8/2008 |
| JP | WO2009-093455 A1 | 7/2009 |
| JP | 2009-176967 A | 8/2009 |
| KR | 10-0663975 B1 | 1/2007 |
| KR | 10-2009-0026665 A | 3/2009 |
| KR | 10-2009-0026667 A | 3/2009 |
| KR | 10-2011-0016115 A | 2/2011 |
| KR | 10-1316720 B1 | 10/2013 |
| KR | 10-2013-0122618 A | 11/2013 |
| KR | 10-1389755 B1 | 4/2014 |
| WO | WO 2005/104255 A2 | 11/2005 |

OTHER PUBLICATIONS

Extended European Search Report dated Nov. 28, 2018, for corresponding European Patent Application No. 16864504.2.
Duan et al., "Thermoelectric properties of Sn substituted p-type Nd filled skutterudites", Journal of Alloys and Compounds, vol. 639, 2015, pp. 68-73.
Grytsiv et al., "Novel thermoelectric skutterudites, $Sn_yNi_4Sb_{12-x}Sn_x$", Physica B, vol. 328, 2003, pp. 71-73.
Hasaka et al., "Thermoelectric properties of the filled skutterudite in the Ce—Fe—Co—Sb—Sn system", 2006 International Conference on Thermoelectrics, 2006, pp. 627-630.
International Search Report issued in PCT/KR2016/012530 (PCT/ISA/210), dated Feb. 8, 2017.
Liu et al., "p-Type skutterudites $R_xM_yFe_3CoSB_{12}$ (R, M=Ba, Ce, Nd, and Yb): Effectiveness of double-filling for the lattice thermal conductivity reduction", Intermetallics, vol. 19, 2011, pp. 1747-1751.
Rogl et al., "New bulk p-type skutterudites $DD_{0.7}Fe_{2.7}Co_{1.3}Sb_{12-x}X_x$ (X=Ge, Sn) reaching ZT>1.3", Acta Materialia, vol. 91, 2015, pp. 227-238.

* cited by examiner

[FIG. 1]
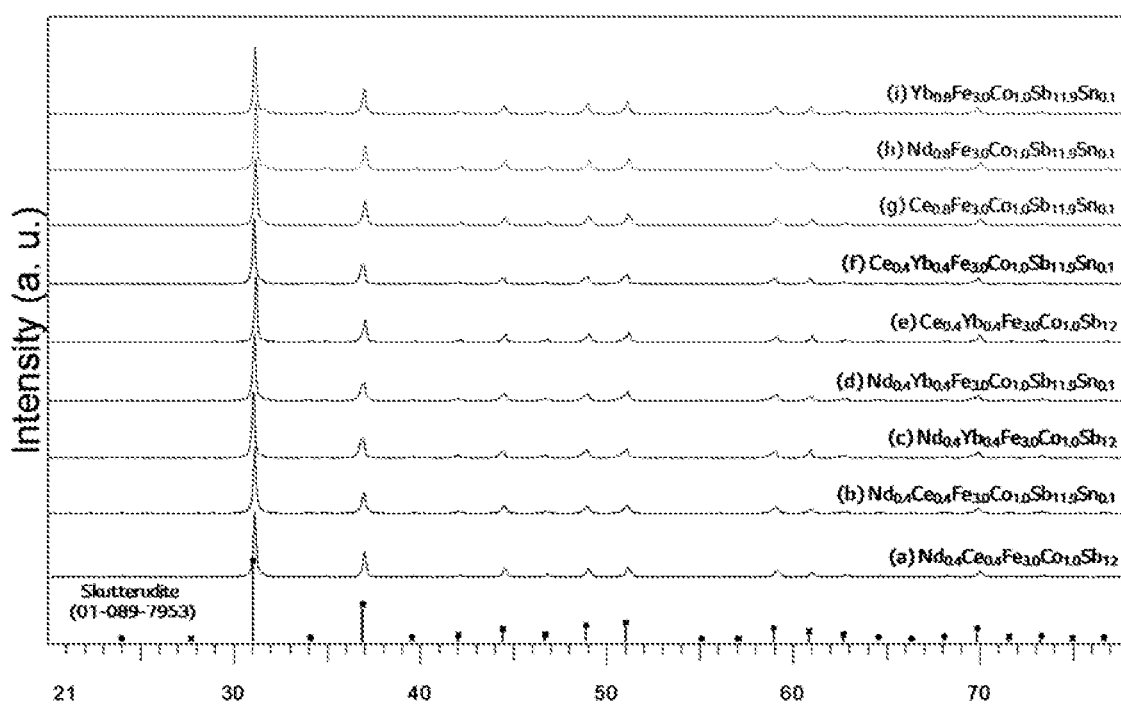

[FIG. 2]
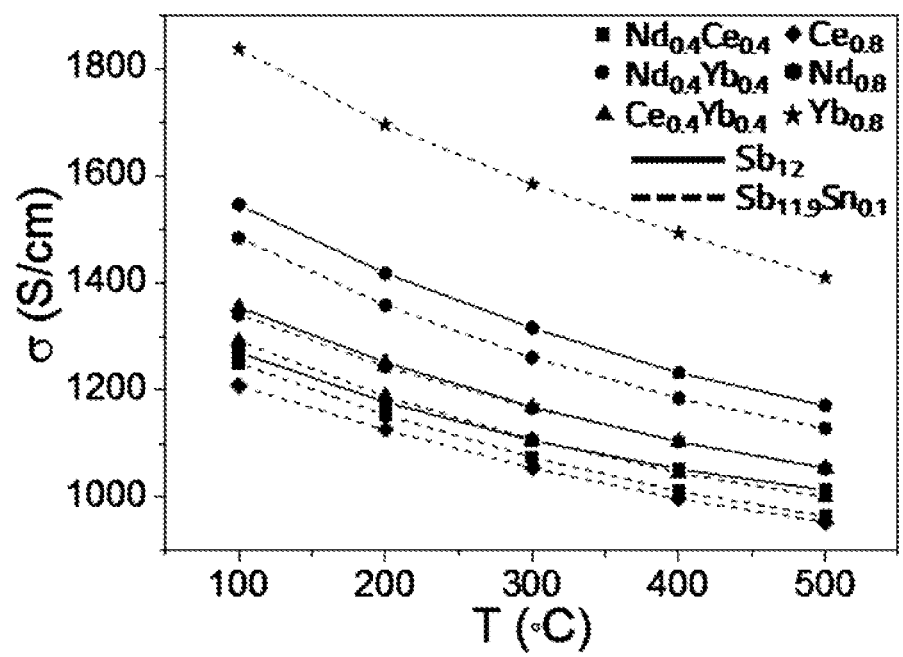

[FIG. 3]
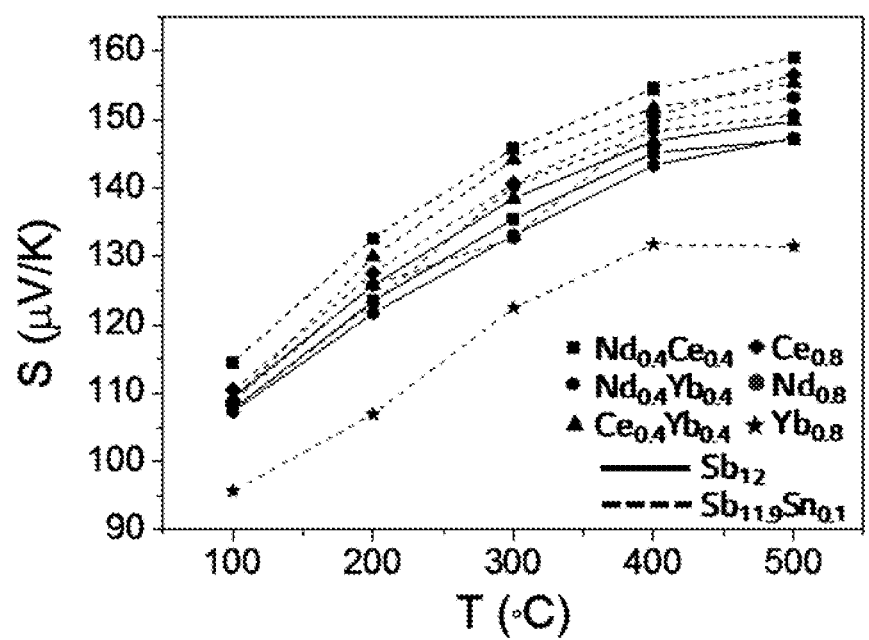

[FIG. 4]
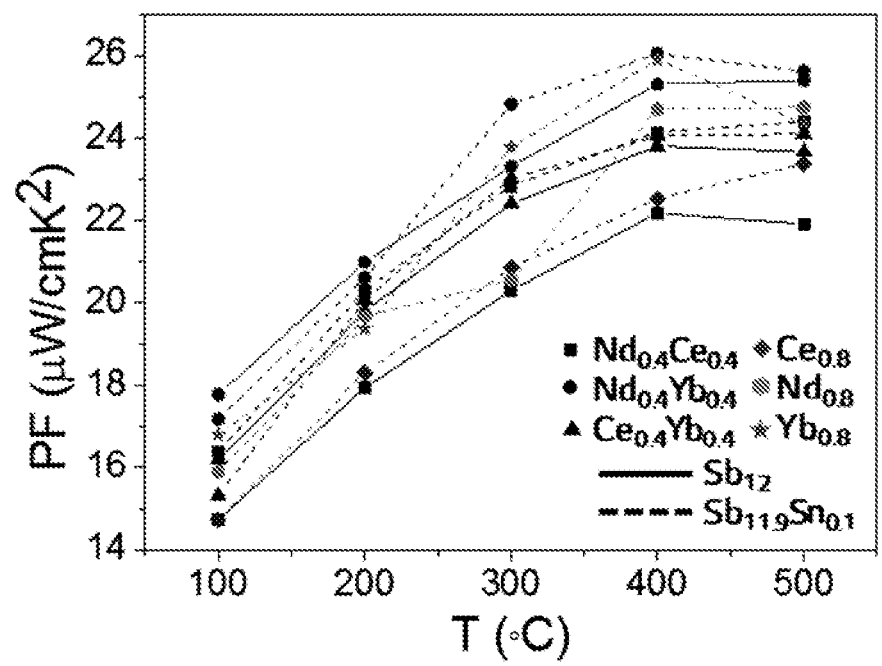

[FIG. 5]
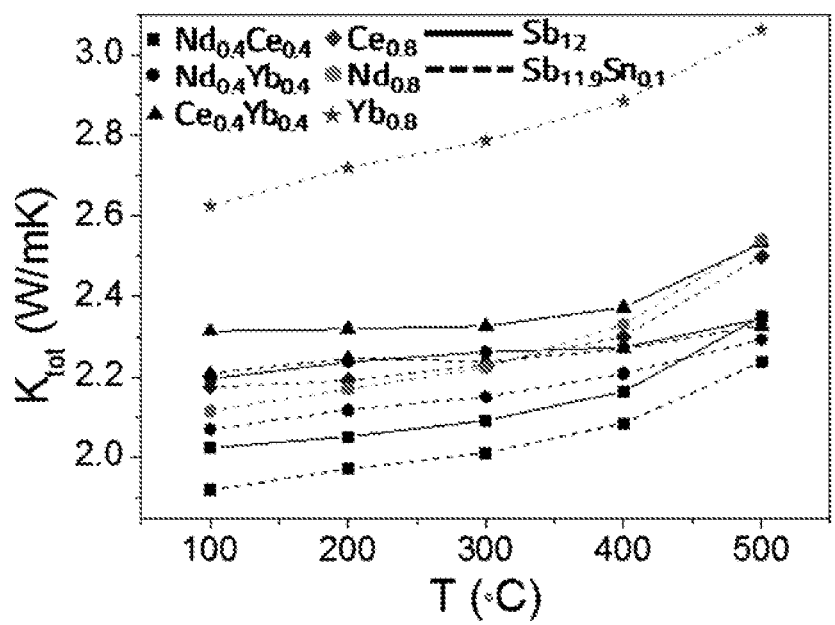

[FIG. 6]
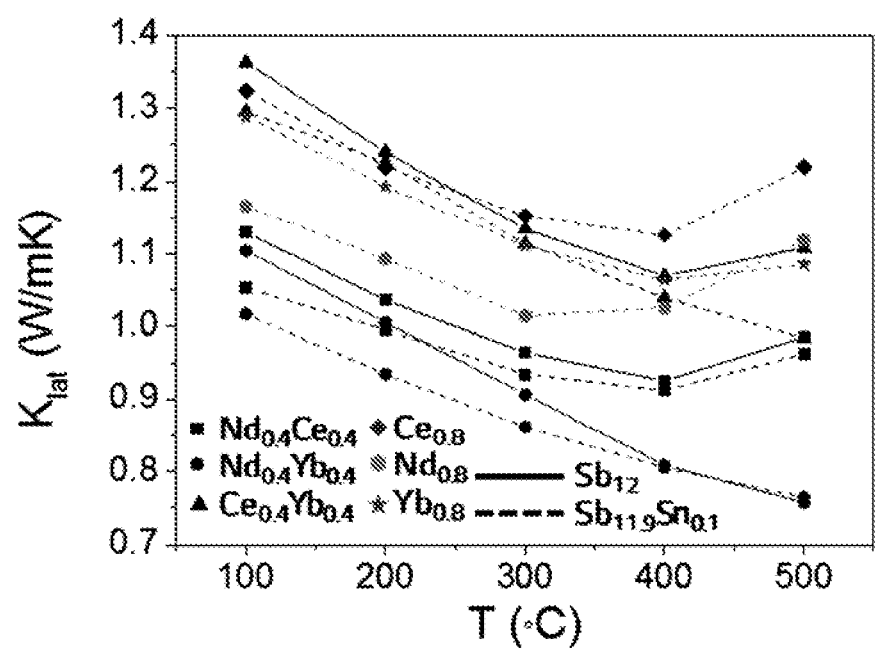

[FIG. 7]
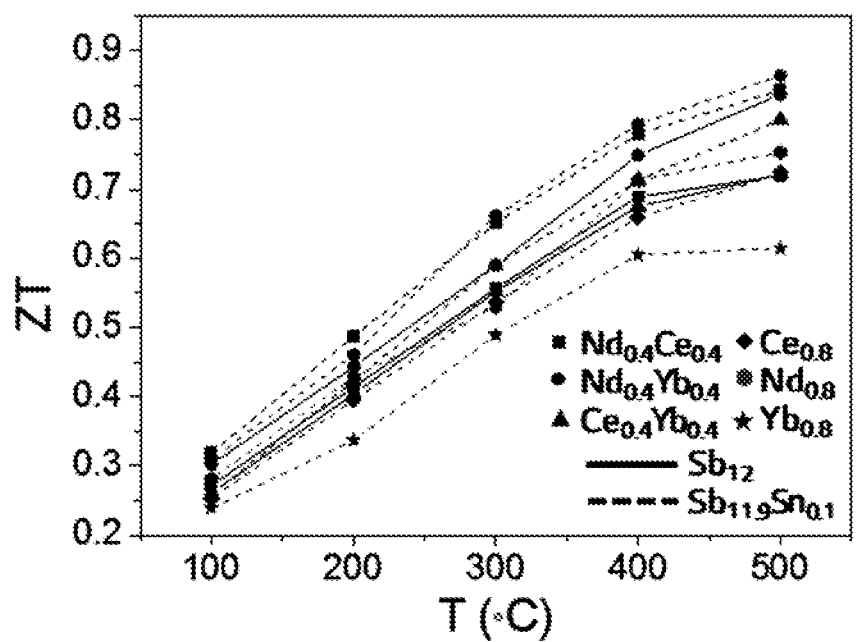

P-TYPE SKUTTERUDITE THERMOELECTRIC MATERIAL, METHOD FOR PREPARING THE SAME, AND THERMOELECTRIC DEVICE INCLUDING THE SAME

CROSS-REFERENCE TO RELATED APPLICATION(S)

This application claims the benefit of Korean Patent Application No. 10-2015-0158244 filed on Nov. 11, 2015 and Korean Patent Application No. 10-2016-0133019 filed on Oct. 13, 2016 with the Korean Intellectual Property Office, the disclosures of which are herein incorporated by reference in their entirety.

TECHNICAL FIELD

The present invention relates to P-type skutterudite thermoelectric material, a method for preparing the same, and a thermoelectric device including the same, and more specifically, to a P-type skutterudite thermoelectric material into which a specific filler and charge compensator are introduced, and which exhibits high thermoelectric performance, a method for preparing the same, and a thermoelectric device including the same.

BACKGROUND ART

Recently, due to environmental problems caused by combustion and exhaustion of resources, studies on thermoelectric materials using waste heat for alternative energy are being accelerated.

The energy conversion efficiency of such thermoelectric materials depends on the performance index value of the thermoelectric material (ZT). Here, ZT is determined according to the Seebeck coefficient, electrical conductivity, thermal conductivity, etc., and more specifically, it is proportional to the square of the Seebeck coefficient and electrical conductivity, and is inversely proportional to thermal conductivity. Thus, in order to increase the energy conversion efficiency of thermoelectric conversion devices, it is required to develop thermoelectric conversion materials with a high Seebeck coefficient or electrical conductivity, or low thermal conductivity.

In general, in order to have excellent thermoelectric performance, a large unit lattice, a complicated crystal structure, a heavy atomic mass, a strong covalent bond, a large mass of available carrier, high carrier mobility, a narrow energy band gap, a small electronegativity difference between constructional atoms, etc. are required, and skutterudite is regarded as a most promising thermoelectric material in the application field of a 500 to 900 K intermediate temperature range, due to a narrow energy band gap, a high charge transport speed, etc.

However, skutterudite exhibits thermoelectric performance of poor efficiency due to relatively high lattice thermal conductivity. In order to improve this, a method of filling two voids existing in the unit lattice of skutterudite with fillers to induce a rattling effect, thereby decreasing lattice thermal conductivity, and a method of substituting a part of elements with doping elements to control the concentration of hole carriers and induce lattice scattering, thereby improving the thermoelectric performance index, are being suggested.

However, most studies are limited to N-type skutterudite, and although there have been reports regarding improvement in the performance index (ZT) of N-type skutterudite through multi-void filling, the results of studies regarding P-type skutterudite are relatively slight, and the thermoelectric properties are low compared to N-type filled skutterudite. Thus, there is a continued demand for the development of a P-type skutterudite thermoelectric material with excellent thermoelectric performance.

DETAILED DESCRIPTION OF THE INVENTION

Technical Problem

It is an object of the present invention to provide a P-type skutterudite thermoelectric material having excellent thermoelectric performance.

It is another object of the present invention to provide a method for preparing the P-type skutterudite thermoelectric material.

It is still another object of the present invention to provide a thermoelectric device including the P-type skutterudite thermoelectric material.

Technical Solution

The present invention provides a P-type skutterudite thermoelectric material represented by the following Chemical Formula 1.

Further, the present invention provides a method for preparing a P-type skutterudite thermoelectric material including the steps of: melting a mixture of raw materials of Fe, Co, and Sb, two or more kinds of raw materials selected from the group consisting of Ce, La, Sm, Nd, Yb, In, and Ba, and one or more kinds of raw materials selected from the group consisting of Sn, Ge, Se, and Te; cooling the molten mixture to form an ingot; annealing the ingot; grinding the ingot into a powder; and sintering the powder.

The present invention also provides a thermoelectric device including the P-type skutterudite thermoelectric material.

Hereinafter, a P-type skutterudite thermoelectric material, a method for preparing the same, and a thermoelectric device including the same according to specific embodiments of the present invention will be explained in detail.

According to one embodiment of the present invention, a P-type skutterudite thermoelectric material represented by the following Chemical Formula 1 is provided.

$$M_xFe_{4-y}Co_ySb_{12-z}H_z$$ [Chemical Formula 1]

In Chemical Formula 1,

M is two or more kinds of elements selected from the group consisting of Ce, La, Sm, Nd, Yb, In, and Ba, H is one or more kinds of elements selected from the group consisting of Sn, Ge, Se, and Te, $0<x\leq 1$, $0<y<4$, and $0<z<12$.

The present inventors proceeded with studies on a P-type skutterudite thermoelectric material having excellent thermoelectric performance, confirmed through experiments that if a P-type skutterudite thermoelectric material is multi-filled with two or more kinds selected from the group consisting of Ce, La, Sm, Nd, Yb, In, and Ba as fillers, and doped with specific charge compensators at the Fe site and Sb site, lattice thermal conductivity may be lowered, and the power factor may increase, thereby exhibiting high thermoelectric conversion efficiency, and completed the invention.

More specifically, in the unit lattice of the P-type skutterudite thermoelectric material, two voids exist, and if these voids are filled with fillers represented by M in Chemical Formula 1, a rattling effect may be induced to decrease lattice thermal conductivity, and additional electrons may be supplied to change the concentration of hole carriers. As such, the P-type skutterudite thermoelectric material with decreased lattice thermal conductivity and an improved power factor may exhibit more improved thermoelectric properties.

Here, by multi-filling two or more kinds selected from the group consisting of Ce, La, Sm, Nd, Yb, In, and Ba as a filler, a thermoelectric material having more improved thermoelectric properties compared to those using one kind of filler can be provided. And, as the filler, more preferably, two or more kinds selected from the group consisting of Nd, Ce, and Yb may be multi-filled, and specifically, Nd and Ce may be multi-filled, Nd and Yb may be multi-filled, or Ce and Yb may be multi-filled.

At the Fe site of the P-type skutterudite thermoelectric material, a Co charge compensator is doped, and the y value in Chemical Formula 1 represents the amount of Co doped at the Fe site and has a value in the range of $0<y<4$. Particularly, if the y value representing the doped amount of Co exceeds 1.5, the concentration of hole carriers may decrease according to the x, z values, and P-type properties may be deteriorated, and thus it is preferable that the y value is in the range of $0<y\leq1.5$ so as to control the concentration of hole carriers according to the x, z values.

The P-type skutterudite thermoelectric material is doped with a specific charge compensator represented by H in Chemical Formula 1 at the Sb site, as well as at the Fe site. Here, the H is one or more kinds selected from the group consisting of Sn, Ge, Se, and Te, and the doped amount of z, i.e., the amount of H doped at the Sb site, has a value in the range of $0<z<12$. Particularly, if the z value representing the doped amount of H exceeds 0.2, thermoelectric properties may be lowered due to the formation of a secondary phase, and thus it is preferable that z is in the range of $0<z\leq0.2$.

As such, the P-type skutterudite thermoelectric material that is doped with specific charge compensators at the Sb site as well as at the Fe site may control and optimize the concentration of hole carriers, and decrease lattice thermal conductivity, and thus produce a higher thermoelectric performance index (ZT).

Particularly, it is preferable that Sn or Te is used as the charge compensator doped at the Sb site, because, in the P-type skutterudite thermoelectric material, Sn may provide one additional hole, Te may provide one additional electron, and by appropriately using Sn or Te alone or in combination, the concentration of hole carriers may be controlled and optimized.

Specific examples of the P-type skutterudite thermoelectric material represented by Chemical Formula 1 may include $Nd_{0.4}Ce_{0.4}Fe_{3.0}Co_{1.0}Sb_{11.9}Sn_{0.1}$, $Nd_{0.4}Yb_{0.4}Fe_{3.0}Co_{1.0}Sb_{11.9}Sn_{0.1}$, $Ce_{0.4}Yb_{0.4}Fe_{3.0}Co_{1.0}Sb_{11.9}Sn_{0.1}$, etc.

Meanwhile, according to another embodiment of the invention, a method for preparing a P-type skutterudite thermoelectric material is provided, including the steps of:

melting a mixture including raw materials of Fe, Co, and Sb, two or more kinds of raw materials selected from the group consisting of Ce, La, Sm, Nd, Yb, In, and Ba, and one or more kinds of raw materials selected from the group consisting of Sn, Ge, Se, and Te;

cooling the molten mixture to form an ingot;

annealing the ingot;

grinding the ingot into a powder; and sintering the powder.

As explained above, the present inventors progressed studies on a P-type skutterudite thermoelectric material having excellent thermoelectric performance, confirmed through experiments that the P-type skutterudite thermoelectric material prepared by the above described method includes two or more kinds of fillers selected from the group consisting of Ce, La, Sm, Nd, Yb, In, and Ba, and is doped with specific charge compensators at the Fe site and the Sb site, and thus has low lattice thermal conductivity and a high power factor, thereby exhibiting high thermoelectric conversion efficiency, and completed the invention.

More specifically, raw materials of Fe, Co, and Sb, two or more kinds of raw materials selected from the group consisting of Ce, La, Sm, Nd, Yb, In, and Ba, and one or more kinds of raw materials selected from the group consisting of Sn, Ge, Se, and Te, are stoichiometrically weighed, mixed, and charged into a quartz tube, and then the mixture may be melted. Here, in order to prevent the reaction between the raw materials and the quartz tube, the mixture may first be introduced into a carbon crucible and then charged into a quartz tube.

The mixture may be melted at a temperature of about 950° C. to 1200° C., inside a quartz tube of a vacuum and sealed state.

Next, the molten mixture is cooled to form an ingot. The cooling includes natural cooling, cooling with a medium, etc., and any cooling methods used in the field of thermoelectric materials may be applied without limitations.

The ingot may be annealed at about 400° C. to 800° C. for 10 to 200 hours.

Next, the annealed ingot may be ground into a powder, it may be ground so that the powder may have a particle diameter of 100 μm or less, and grinding methods and devices used in the field of thermoelectric materials may be applied without limitations.

The ground powder may be sintered. The sintering may be conducted at a temperature of about 500° C. to 700° C. using spark plasma sintering, and the sintering time may preferably be 5 to 60 minutes under pressure of 10 to 100 MPa.

According to still another embodiment of the invention, a thermoelectric device including the P-type skutterudite thermoelectric material of the above described embodiment is provided.

As explained above, since the P-type skutterudite thermoelectric material of the above-described embodiment has low lattice thermal conductivity and a high power factor, and thus exhibits improved thermoelectric conversion efficiency, the thermoelectric device including the same also has a high thermoelectric performance index (ZT), and thus can be usefully applied in the field of future technology capable of utilizing a thermoelectric generating device.

Advantageous Effects

According to the present invention, a P-type skutterudite thermoelectric material into which a specific filler and charge compensator are introduced, and which exhibits high thermoelectric performance, a method for preparing the same, and a thermoelectric device including the same are provided.

BRIEF DESCRIPTION OF DRAWINGS

FIG. 1 shows XRD analysis results of the skutterudites prepared in examples and comparative examples.

FIG. 2 is a graph showing electrical conductivities of the skutterudites prepared in examples and comparative examples.

FIG. 3 is a graph showing Seebeck coefficients of the skutterudites prepared in examples and comparative examples.

FIG. 4 is a graph showing power factors of the skutterudites prepared in examples and comparative examples.

FIG. 5 is a graph showing total thermal conductivities of the skutterudites prepared in examples and comparative examples.

FIG. 6 is a graph showing lattice thermal conductivities of the skutterudites prepared in examples and comparative examples.

FIG. 7 is a graph showing the thermoelectric performance indexes (ZT) of the skutterudites prepared in examples and comparative examples.

DETAILED DESCRIPTION OF THE EMBODIMENTS

The present invention will be explained in more detail in the following examples. However, these examples are presented only as the illustrations of the present invention, and the scope of the present invention is not limited thereby.

Example 1: Preparation of $Nd_{0.4}Ce_{0.4}Fe_{3.0}Co_{1.0}Sb_{11.9}Sn_{0.1}$

High purity raw materials Nd, Ce, Fe, Co, Sb, and Sn were weighed at a mole ratio of 0.4:0.4:3:1:11.9:0.1 in a glove box and put into a carbon crucible, and then charged into a quartz tube. The inside of the quartz tube was put under vacuum and sealed. The raw materials were then melted at 1100° C., and isothermally maintained in a furnace for 24 hours. Next, the quartz tube was naturally cooled to room temperature to form an ingot, which was then isothermally maintained at 650° C. for 72 hours in a furnace to anneal. The annealed ingot material was finely ground into a powder with a particle diameter of 75 μm or less, and sintered by a spark plasma sintering method (SPS) at a temperature of 630° C. and a pressure of 50 MPa for 10 minutes to prepare a P-type skutterudite thermoelectric material.

Example 2: Preparation of $Nd_{0.4}Yb_{0.4}Fe_{3.0}Co_{1.0}Sb_{11.9}Sn_{0.1}$

A P-type skutterudite thermoelectric material was prepared by the same method as Example 1, except that high purity raw materials Nd, Yb, Fe, Co, Sb, and Sn were used at a mole ratio of 0.4:0.4:3:1:11.9:0.1.

Example 3: Preparation of $Ce_{0.4}Yb_{0.4}Fe_{3.0}Co_{1.0}Sb_{11.9}Sn_{0.1}$

A P-type skutterudite thermoelectric material was prepared by the same method as Example 1, except that high purity raw materials Ce, Yb, Fe, Co, Sb, and Sn were used at a mole ratio of 0.4:0.4:3:1:11.9:0.1.

Comparative Example 1: Preparation of $Nd_{0.4}Ce_{0.4}Fe_{3.0}Co_{1.0}Sb_{12}$

A P-type skutterudite thermoelectric material was prepared by the same method as Example 1, except that high purity raw materials Nd, Ce, Fe, Co, and Sb were used at a mole ratio of 0.4:0.4:3:1:12.

Comparative Example 2: Preparation of $Nd_{0.4}Yb_{0.4}Fe_{3.0}Co_{1.0}Sb_{12}$

A P-type skutterudite thermoelectric material was prepared by the same method as Example 1, except that high purity raw materials Nd, Yb, Fe, Co, and Sb were used at a mole ratio of 0.4:0.4:3:1:12.

Comparative Example 3: Preparation of $Ce_{0.04}Yb_{0.4}Fe_{3.0}Co_{1.0}Sb_{12}$ A P-type skutterudite thermoelectric material was prepared by the same method as Example 1, except that high purity raw materials Ce, Yb, Fe, Co, and Sb were used at a mole ratio of 0.4:0.4:3:1:12.

Comparative Example 4: Preparation of $Ce_{0.8}Fe_{3.0}Co_{1.0}Sb_{11.9}Sn_{0.1}$ A P-type skutterudite thermoelectric material was prepared by the same method as Example 1, except that high purity raw materials Ce, Fe, Co, Sb, and Sn were used at a mole ratio of 0.8:3:1:11.9:0.1.

Comparative Example 5: Preparation of $Nd_{0.8}Fe_{3.0}Co_{1.0}Sb_{11.9}Sn_{0.1}$ A P-type skutterudite thermoelectric material was prepared by the same method as Example 1, except that high purity raw materials Nd, Fe, Co, Sb, and Sn were used at a mole ratio of 0.8:3:1:11.9:0.1.

Comparative Example 6: Preparation of $Yb_{0.8}Fe_{3.0}Co_{1.0}Sb_{1.9}Sn_{1.0}$ A P-type skutterudite thermoelectric material was prepared by the same method as Example 1, except that high purity raw materials Yb, Fe, Co, Sb, and Sn were used at a mole ratio of 0.8:3:1:11.9:0.1.

Experimental Examples

1. Phase Analysis According to XRD Pattern

For the P-type skutterudite thermoelectric materials prepared in the examples and comparative examples, phase analysis was conducted using an X-ray diffractometer (XRD) and the results are shown in FIG. 1.

In FIGS. 1 (a), (c), and (e) show the analysis results of Comparative Examples 1, 2, and 3, respectively having the compositions of $Nd_{0.4}Ce_{0.4}Fe_3CoSb_{12}$, $Nd_{0.4}Yb_{0.4}Fe_3CoSb_{12}$, and $Ce_{0.4}Yb_{0.4}Fe_3CoSb_{12}$, (b), (d), and (f) show the analysis results of Examples 1, 2, and 3 respectively having the compositions of $Nd_{0.4}Ce_{0.4}Fe_3CoSb_{11.9}Sn_{0.1}$, $Nd_{0.4}Yb_{0.4}Fe_3CoSb_{11.9}Sn_{0.1}$, and $Ce_{0.4}Yb_{0.4}Fe_3CoSb_{11.9}Sn_{0.1}$, (g), (h), and (i) show the analysis results of Comparative Examples 4, 5, and 6 respectively having the compositions of $Ce_{0.8}Fe_3CoSb_{11.9}Sn_{0.1}$, $Nd_{0.8}Fe_3CoSb_{11.9}Sn_{0.1}$, and $Yb_{0.8}Fe_3CoSb_{11.9}Sn_{0.1}$, and the diffraction patterns correspond well to the standard data of skutterudite of the ICDD (International Centre for Diffraction Data).

2. Temperature Dependence of Electrical Conductivity

For the P-type skutterudite thermoelectric material specimens prepared in the examples and comparative examples, electrical conductivities were measured according to temperature change and are shown in FIG. 2, and the average values of 100 to 500° C. are described in Table 1.

The decrease in the electrical conductivity of the P-type skutterudite thermoelectric material of the examples and comparative examples according to temperature increase indicates that the synthesized skutterudite is a degenerate semiconductor. Further, the electrical conductivity differs according to the oxidation state ($Yb^{+2}$, $Nd^{+2\sim+3}$, or $Ce^{+3\sim+4}$) of the raw materials used as a filler (M), and more specifically, in case the filler is used at the same mole ratio (x=0.8), since the combinations of fillers having lower oxidation states supply a smaller number of electrons to the skutterudite structure, the concentration of holes, i.e., P-type charge carriers, increases, thereby exhibiting high electrical conductivity. As shown in FIG. 2, Comparative Example 6 wherein only Yb was used as a filler exhibits the highest electrical conductivity, and the electrical conductivity decreases in the order of (Nd,Yb), (Ce,Yb), Nd, (Nd,Ce), and Ce. Meanwhile, in Examples 1, 2, and 3, compared to Comparative Examples 1, 2, and 3 wherein Sn was not doped at the Sb site, electrical conductivities decreased, and it can be inferred that while Sb was substituted with Sn, point defect scattering was caused to hinder the migration of holes.

3. Measurement of Seebeck Coefficient and Temperature Dependence of Seebeck Coefficient For the P-type skutterudite thermoelectric material specimens prepared in the examples and comparative examples, Seebeck coefficients (S) were measured according to temperature change and are shown in FIG. 3, and the average values of 100 to 500° C. are described in Table 1.

As shown in FIG. 3, all the specimens exhibited positive (+) Seebeck coefficients, and thus can be evaluated as exhibiting p-type conductivities. Further, it can be confirmed that in the case of Examples 1, 2, and 3 wherein two kinds of fillers were used and Sn was doped at the Sb site, compared to Comparative Examples 1, 2, and 3 wherein Sn was not doped at the Sb site, and Comparative Examples 4, 5, and 6 wherein one kind of filler was used, the Seebeck coefficients further increased according to temperature rise.

4. Temperature Dependence of Power Factor

For the P-type skutterudite thermoelectric material specimens prepared in the examples and comparative examples, power factors were calculated according to temperature change and are shown in FIG. 4, and the average values of 100 to 500° C. are described in Table 1.

The power factor is defined as power factor=$\sigma S^2$, and was calculated using the $\sigma$ (electrical conductivity) and S (Seebeck coefficient) shown in FIG. 2 and FIG. 3.

As shown in FIG. 4, the power factor showed a tendency to increase to be saturated, and then decrease according to temperature rise, and in the case of Examples 1, 2, and 3 wherein two kinds of fillers were used and Sn doping was conducted, compared to Comparative Examples 1, 2, and 3 without Sn doping and Comparative Examples 4, 5, and 6 wherein one kind of filler was used, much superior power factors were exhibited, and particularly, in the case of $Nd_{0.4}Yb_{0.4}Fe_3CoSb_{11.9}Sn_{0.1}$ of Example 2, the power factor measured at 400° C. was as high as about 26 $\mu W/cmK^2$.

5. Temperature Dependence of Thermal Conductivity

For the P-type skutterudite thermoelectric material specimens prepared in the examples and comparative examples, thermal conductivities were measured according to temperature change and are shown in FIG. 5 and FIG. 6.

Total thermal conductivity ($\kappa=\kappa_L+\kappa_E$) is divided into lattice thermal conductivity ($\kappa_L$) and thermal conductivity ($\kappa_E$) calculated according to the Wiedemann-Franz law ($\kappa_E=\sigma LT$), wherein as the Lorenz number (L), a value calculated from the Seebeck coefficient according to temperature was used. The total thermal conductivity $\kappa$ is shown in FIG. 5, the average value of 100 to 500° C. is described in Table 1, and the lattice thermal conductivity ($\kappa_L$) is shown in FIG. 6.

As shown in FIG. 5, in the case of skutterudites of Examples 1, 2, and 3 using two kinds of fillers and Sn-doped, compared to Comparative Examples 1, 2, and 3 without Sn doping and Comparative Examples 4, 5, and 6 using one kind of filler, thermal conductivities further decreased, respectively.

Further, as shown in FIG. 6, the Sn-doped skutterudites of Examples 1, 2, and 3 exhibited low lattice thermal conductivities, compared to Comparative Examples 1, 2, and 3, because the doped Sn acted as a phonon scattering center. Particularly, $Nd_{0.4}Yb_{0.4}Fe_3CoSb_{11.9}Sn_{0.1}$ of Example 2 exhibited a very low value of about 0.76 W/mK at 500° C.

6. Temperature Dependence of Thermoelectric Performance Index (ZT)

For the P-type skutterudite thermoelectric material specimens prepared in the examples and comparative examples, dimensionless thermoelectric performance indexes (ZT) were calculated according to temperature change and are shown in FIG. 7, and the average values of 100 to 500° C. are described in Table 1.

The thermoelectric performance index is defined as ZT=$S^2\sigma T/\kappa$, and is calculated using the values of S (Seebeck coefficient), $\sigma$ (electrical conductivity), T (absolute temperature), and $\kappa$ (total thermal conductivity) obtained in the experimental examples.

Referring to FIG. 7 and Table 1, it can be confirmed that the ZT value increased according to temperature rise, and the skutterudites of Examples 1, 2, and 3 using two kinds of fillers and Sn-doped exhibited high thermoelectric performance indexes (ZT), compared to Comparative Examples 1, 2, and 3 without Sn doping and Comparative Examples 4, 5, and 6 using one kind of filler.

7. Comparison of Lattice Parameter and 100~500° C. Average Thermoelectric Properties For the P-type skutterudite thermoelectric material specimens prepared in the examples and comparative examples, lattice parameters and 100~500° C. average thermoelectric property values are shown in the following Table 1.

TABLE 1

| Unit | Lattice parameter (Å) | Electrical conductivity (S/cm) | Seebeck coeff. (μV/K) | Power factor (μW/cmK$^2$) | Thermal conductivity (W/mK) | ZT average |
|---|---|---|---|---|---|---|
| | | | 100~500° C. average thermoelectric property values | | | |
| Example 1 | 9.1148 | 1091 | 141 | 21.6 | 2.04 | 0.62 |
| Comparative Example 1 | 9.1137 | 1124 | 132 | 19.4 | 2.14 | 0.53 |
| Example 2 | 9.1198 | 1283 | 134 | 22.9 | 2.17 | 0.62 |
| Comparative Example 2 | 9.1182 | 1336 | 131 | 22.6 | 2.26 | 0.58 |
| Example 3 | 9.1201 | 1126 | 138 | 21.3 | 2.26 | 0.56 |
| Comparative Example 3 | 9.1191 | 1186 | 134 | 21.2 | 2.37 | 0.52 |
| Comparative Example 4 | 9.1215 | 1067 | 137 | 19.9 | 2.28 | 0.51 |
| Comparative Example 5 | 9.1103 | 1181 | 134 | 21.1 | 2.28 | 0.54 |
| Comparative Example 6 | 9.1286 | 1603 | 117 | 22.0 | 2.82 | 0.46 |

As shown in Table 1, in the case of the skutterudites of Examples 1, 2, and 3 which are multi-filled and Sn-doped, the lattice parameters increased compared to Comparative Examples 1, 2, and 3 without Sn doping, indicating that large-sized Sn was properly substituted at the Sb site. Meanwhile, in the case of Comparative Examples 4, 5, and 6 which are Sn-doped and use a single filler, the lattice parameter increased in the order of Yb, Ce, and Nd with large size.

Further, in the case of skutterudites of Examples 1, 2, and 3 using two kinds of fillers, and simultaneously being Sn-doped, compared to Comparative Examples 1, 2, and 3 without Sn doping, and Comparative Examples 4, 5, and 6 which are filled with a single filler and are Sn-doped, the average power factors at 100 to 500° C. were improved and the average thermal conductivities decreased, and thus thermoelectric performance indexes (ZT) were improved.

The invention claimed is:

1. A P-type skutterudite thermoelectric material represented by the following Chemical Formula 1:

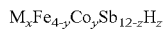

$M_xFe_{4-y}Co_ySb_{12-z}H_z$ wherein, in Chemical Formula 1,
M is two or three elements selected from the group consisting of Ce, Nd, and Yb,
H is one or more elements selected from the group consisting of Sn, Ge, Se, and Te, $0<x\leq1$, $0<y\leq1.5$, and $0<z\leq0.2$.

2. The P-type skutterudite thermoelectric material according to claim 1, wherein M is two elements selected from the group consisting of Nd, Ce, and Yb.

3. The P-type skutterudite thermoelectric material according to claim 1, wherein H is Sn or Te.

4. The P-type skutterudite thermoelectric material according to claim 1, wherein the P-type skutterudite thermoelectric material represented by Chemical Formula 1 is selected from the group consisting of $Nd_{0.4}Ce_{0.4}Fe_{3.0}Co_{1.0}Sb_{11.9}Sn_{0.1}$, $Nd_{0.4}Yb_{0.4}Fe_{3.0}Co_{1.0}Sb_{11.9}Sn_{0.1}$, and $Ce_{0.4}Yb_{0.4}Fe_{3.0}Co_{1.0}Sb_{11.9}Sn_{0.1}$.

5. A method for preparing a P-type skutterudite thermoelectric material according to claim 1, comprising the steps of:
melting a mixture comprising raw materials of Fe, Co, and Sb, two or three raw materials selected from the group consisting of Ce, Nd, and Yb, and one or more raw materials selected from the group consisting of Sn, Ge, Se, and Te;
cooling the molten mixture to form an ingot;
annealing the ingot;
grinding the ingot into a powder; and
sintering the powder.

6. The method for preparing a P-type skutterudite thermoelectric material according to claim 5, wherein the melting temperature is 950° C. to 1200° C.

7. The method for preparing a P-type skutterudite thermoelectric material according to claim 5, wherein the annealing temperature is 400° C. to 800° C.

8. The method for preparing a P-type skutterudite thermoelectric material according to claim 5, wherein the sintering temperature is 500° C. to 700° C.

9. A thermoelectric device comprising a P-type skutterudite thermoelectric material according to claim 1.

* * * * *